(12) United States Patent
Benesch et al.

(10) Patent No.: US 7,794,841 B2
(45) Date of Patent: *Sep. 14, 2010

(54) ARTICLES OF MANUFACTURE CONTAINING INCREASED STABILITY LOW CONCENTRATION GASES AND METHODS OF MAKING AND USING THE SAME

(75) Inventors: Robert Benesch, Chicago, IL (US); Malik Haouchine, Chicago, IL (US); Tracey Jacksier, Lisle, IL (US)

(73) Assignee: American Air Liquide, Inc., Fremont, CA (US)

(*) Notice: Subject to any disclaimer, the term of this patent is extended or adjusted under 35 U.S.C. 154(b) by 462 days.

This patent is subject to a terminal disclaimer.

(21) Appl. No.: 11/168,948

(22) Filed: Jun. 28, 2005

(65) Prior Publication Data

US 2005/0271544 A1    Dec. 8, 2005

Related U.S. Application Data

(60) Continuation-in-part of application No. 11/063,928, filed on Feb. 22, 2005, which is a division of application No. 10/157,468, filed on May 29, 2002, now abandoned, application No. 11/168,948, which is a continuation-in-part of application No. 10/157,466, filed on May 29, 2002, now abandoned.

(60) Provisional application No. 60/583,126, filed on Jun. 25, 2004, provisional application No. 60/306,014, filed on Jul. 17, 2001.

(51) Int. Cl.
*B65D 85/00* (2006.01)
*B65D 90/04* (2006.01)
*C23C 8/06* (2006.01)

(52) U.S. Cl. .......... 428/432; 206/0.6; 206/0.7; 252/372; 148/240; 148/279; 148/283

(58) Field of Classification Search .......... 148/240, 148/279, 283; 206/0.6–0.7; 252/372; 428/432
See application file for complete search history.

(56) References Cited

U.S. PATENT DOCUMENTS 2,451,915 A    10/1948    Buresh (Continued)

FOREIGN PATENT DOCUMENTS

CA    614495    2/1961

(Continued)

OTHER PUBLICATIONS

Daniels, F. et al., "Absorption of Gases", Experimental Physical Chemistry, 1970, pp. 369-374, Seventh Edition, McGraw-Hill.

(Continued)

*Primary Examiner*—Roy King
*Assistant Examiner*—Lois Zheng
(74) *Attorney, Agent, or Firm*—Donna Blalock Holguin; Christopher J. Cronin

(57) ABSTRACT

Articles of manufacture and methods of making and using same concern a container having an internal space and a passivated internal metal surface. The container contains a composition of an acid gas and a balance gas contained within the internal space and in contact with the passivated internal metal surface. The stability of the acid gas concentration over time is enhanced.

15 Claims, 7 Drawing Sheets

U.S. PATENT DOCUMENTS

| | | | |
|---|---|---|---|
| 2,700,188 A | 1/1955 | Buresh et al. |
| 2,703,441 A | 3/1955 | Langdon et al. |
| 2,744,294 A | 5/1956 | Buresh et al. |
| 2,882,243 A | 4/1959 | Milton |
| 2,882,244 A | 4/1959 | Milton |
| 2,950,962 A | 8/1960 | Carlson et al. |
| 2,958,593 A | 11/1960 | Hoover et al. |
| 2,972,527 A | 2/1961 | Upton, Jr. |
| 2,991,151 A | 7/1961 | Breck et al. |
| 2,995,423 A | 8/1961 | Breck et al. |
| 2,996,358 A | 8/1961 | Milton |
| 3,001,869 A | 9/1961 | Longstreth et al. |
| 3,008,803 A | 11/1961 | Milton |
| 3,010,789 A | 11/1961 | Milton |
| 3,012,853 A | 12/1961 | Milton |
| 3,044,482 A | 7/1962 | Golden |
| 3,054,657 A | 9/1962 | Breck et al. |
| 3,130,007 A | 4/1964 | Breck |
| 3,140,249 A | 7/1964 | Plank et al. |
| 3,140,252 A | 7/1964 | Frilette at al. |
| 3,140,253 A | 7/1964 | Plank et al. |
| 3,260,582 A | 7/1966 | Zimmer, Jr. et al. |
| 3,638,464 A | 2/1972 | Winter et al. |
| 3,688,453 A | 9/1972 | Legacy et al. |
| 3,780,163 A | 12/1973 | Callighan et al. |
| 3,834,200 A | 9/1974 | Winter |
| 3,847,551 A | 11/1974 | Hutson |
| 3,850,589 A | 11/1974 | Charvat |
| 3,982,359 A | 9/1976 | Elbel et al. |
| 4,049,396 A | 9/1977 | Hiles |
| 4,057,510 A | 11/1977 | Crouch et al. |
| 4,082,834 A | 4/1978 | Grossman et al. |
| 4,135,130 A | 1/1979 | Wootton |
| 4,137,151 A | 1/1979 | Csicsery |
| 4,159,917 A | 7/1979 | Gluck |
| 4,221,572 A | 9/1980 | Torimae et al. |
| 4,227,350 A | 10/1980 | Fitzer |
| 4,351,743 A | 9/1982 | Hashimoto |
| 4,358,627 A | 11/1982 | Ameen et al. |
| 4,385,086 A | 5/1983 | Nakayama et al. |
| 4,414,128 A | 11/1983 | Goffinet |
| 4,459,779 A | 7/1984 | Shen |
| 4,485,519 A | 12/1984 | Collier |
| 4,613,345 A | 9/1986 | Thicke et al. |
| 4,622,253 A | 11/1986 | Levy |
| 4,669,163 A | 6/1987 | Lux et al. |
| 4,713,224 A | 12/1987 | Tamhankar et al. |
| 4,724,819 A | 2/1988 | Fleri |
| 4,781,907 A | 11/1988 | McNeil |
| 4,853,148 A | 8/1989 | Tom et al. |
| 4,902,561 A | 2/1990 | McCullough, Jr. et al. |
| 4,923,828 A | 5/1990 | Gluck et al. |
| 4,925,646 A | 5/1990 | Tom et al. |
| 4,927,432 A | 5/1990 | Budinger et al. |
| 4,931,358 A | 6/1990 | Wahl et al. |
| 4,933,373 A | 6/1990 | Moren |
| 4,935,295 A | 6/1990 | Serafini |
| 4,991,362 A | 2/1991 | Heyer et al. |
| 5,011,512 A | 4/1991 | Wald et al. |
| 5,025,596 A | 6/1991 | Heyer et al. |
| 5,045,355 A | 9/1991 | Spiro et al. |
| 5,062,900 A | 11/1991 | Berneron et al. |
| 5,080,822 A | 1/1992 | VanEenam |
| 5,080,831 A | 1/1992 | VanEenam |
| 5,120,512 A | 6/1992 | Masuda |
| 5,176,782 A | 1/1993 | Ishibashi et al. |
| 5,197,852 A | 3/1993 | Walker et al. |
| 5,203,189 A | 4/1993 | Lovejoy et al. |
| 5,232,467 A | 8/1993 | Child et al. |
| 5,250,085 A | 10/1993 | Mevisson |
| 5,255,445 A | 10/1993 | Li et al. |
| 5,273,558 A | 12/1993 | Nelson et al. |
| 5,296,821 A | 3/1994 | Petersen et al. |
| 5,363,604 A | 11/1994 | Heyer |
| 5,479,727 A | 1/1996 | Fine et al. |
| 5,480,677 A | 1/1996 | Li et al. |
| 5,503,778 A | 4/1996 | Liu et al. |
| 5,573,710 A | 11/1996 | McDonell |
| 5,676,762 A | 10/1997 | Kimura et al. |
| 5,880,850 A | 3/1999 | McAndrew et al. |
| 5,910,292 A | 6/1999 | Alvarez, Jr. et al. |
| 5,963,336 A | 10/1999 | McAndrew et al. |
| 6,054,379 A | 4/2000 | Yau et al. |
| 6,110,258 A | 8/2000 | Fraenkel et al. |
| 6,154,284 A | 11/2000 | McAndrew et al. |
| 6,183,539 B1 | 2/2001 | Rode et al. |
| 6,255,222 B1 | 7/2001 | Xia et al. |
| 6,318,640 B1 | 11/2001 | Coffee |
| 6,325,304 B1 | 12/2001 | Brite et al. |
| 6,328,223 B1 | 12/2001 | Holt et al. |
| 6,328,543 B1 | 12/2001 | Benecke |
| 6,332,562 B1 | 12/2001 | Sweeton |
| 6,334,578 B1 | 1/2002 | House |
| 6,345,404 B1 | 2/2002 | Stephens et al. |
| 6,345,773 B1 | 2/2002 | Shanklin et al. |
| 6,346,201 B1 | 2/2002 | Felkner |
| 6,348,227 B1 | 2/2002 | Caracciolo, Jr. |
| 6,395,070 B1 | 5/2002 | Watanabe et al. |
| 6,444,326 B1 | 9/2002 | Smith |
| 6,511,760 B1 | 1/2003 | Barone et al. |
| 6,752,852 B1 | 6/2004 | Jacksier et al. |
| 6,866,142 B2 | 3/2005 | Lamborne et al. |
| 7,156,225 B2 | 1/2007 | Jacksier et al. |
| 7,229,667 B2 | 6/2007 | Jacksier et al. |
| 2001/0054454 A1 | 12/2001 | Modi |
| 2003/0017359 A1 | 1/2003 | Jacksier et al. |
| 2005/0150779 A1 | 7/2005 | Jacksier et al. |
| 2005/0247196 A1 | 11/2005 | Benesch et al. |
| 2005/0257856 A1 | 11/2005 | Jacksier et al. |
| 2009/0223594 A1 | 9/2009 | Jacksier et al. |

FOREIGN PATENT DOCUMENTS

| | | |
|---|---|---|
| CA | 616981 | 3/1961 |
| CA | 817915 | 7/1969 |
| EP | 0 492 868 A1 | 7/1992 |
| EP | 0517575 | 12/1992 |
| EP | 0575177 | 12/1993 |
| GB | 1245373 | 9/1971 |
| JP | 53-100979 A | 9/1978 |
| JP | 63-057543 A | 3/1988 |
| JP | 62-49765 A | 9/1994 |
| WO | WO 92/01536 | 2/1992 |
| WO | 9943445 | 9/1999 |
| WO | 03008664 | 1/2003 |

OTHER PUBLICATIONS

Brunauer, S. et al., "Absorption of Gases in Multimolecular Layers", J.Am.Chem.Soc., 1938, 60, pp. 309-316.

Wechter, S.G., "Calibration in Air Monitoring—Preparation of Stable Pollution Gas Standards Using Treated Aluminum Cylinders", ASTM Special Technical Publication 598, 1975, pp. 40-54.

Barrett, E.P., at al., "The Determination of Pore Volume and Area Distributions in Porous Substances", J.Am.Chem.Soc., Jan. 1951, 73, pp. 373-380.

Naffin, B. et al., "Removal of Harmful Acid Gases by Passage through Moistened Lime Filter Layers", Zement-Kalk-Gips Int'l, v 49 n Sep. 9, 1996, 14pp.

Database WPI Section Ch, Week 198816, Derwent Publications Ltd., London, GB; Class A41, AN 1988-108798, P002246836 and JP 63057543 A (Seitetsu Chem Ind Co), Mar. 2, 1988.

Welty, et al., "Fundamentals of Momentum, Heat, and Mass Transfer," John Wiley & Sons, 1984, pp. 471-482.

ARTICLES OF MANUFACTURE CONTAINING INCREASED STABILITY LOW CONCENTRATION GASES AND METHODS OF MAKING AND USING THE SAME

CROSS REFERENCE TO RELATED APPLICATIONS

This application is a continuation in part, from: provisional patent application Ser. No. 60/583,126, filed Jun. 25, 2004; copending non-provisional patent application Ser. No. 11/063,928, filed Feb. 22, 2005 which is a divisional of non-provisional patent application Ser. No. 10/157,468, filed May 29, 2002, now abandoned; and from non-provisional patent application Ser. No. 10/157,466, filed May 29, 2002 now abandoned, now published as US 2003/0017359 A1, which claims priority to provisional patent application Ser. No. 60/306,014, filed Jul. 17, 2001. Each of these applications are incorporated by reference herein.

BACKGROUND OF THE INVENTION

Moisture is known to react with so-called "acid gases", such as hydrogen sulfide, carbonylsulfide, carbondisulfide and mercaptans (mercaptans are also referred to as thiols) to form a complex compound. (The term "acid gas" is used herein to denote either gas phase, liquid phase, or mixture of gas and liquid phases, unless the phase is specifically mentioned.)

One problem presents itself: if one is interested in producing acid gas standard compositions, in other words acid gases having a known concentration of one of these gases in a matrix or carrier fluid, then one must consider how to reduce or remove the moisture. Gas standards may have to have, and preferably do have, a long shelf life, since the standard acid gas may not be required immediately after production. A source of acid gas and/or matrix gas may contain a considerable amount of moisture. Therefore, the reduction or removal of moisture from the acid gas is important if the stability of the acid gas in the standard gas is to be maintained.

U.S. Pat. Nos. 5,255,445 and 5,480,677 describe processes for drying and passivating a metal surface to enhance the stability of gas mixtures containing one or more gaseous hydrides in low concentrations in contact therewith. The process comprises purging gas in contact with the metal surface with inert gas to remove the purged gas, exposing the metal surface to an amount of a gaseous passivating or drying agent comprising an effective amount of a gaseous hydride of silicon, germanium, tin or lead and for a time sufficient to passivate the metal surface, and purging the gaseous passivating agent using inert gas. Optionally, an oxidizing agent is applied after the third step to stabilize the adsorbed stabilizing agent. The patent also mentions prior known processes, such as saturation passivation, where the container is subjected to several cycles of evacuating and filling with a much higher concentration of the same gaseous hydride, prior to being filled with the low concentration hydride mixture of interest. The two patents do not mention or describe processes to passivate containers adapted to store sulfur-containing gases, nor do they mention passivation techniques in which a first passivating agent is applied to the surface, followed by contacting with a higher concentration of the gas to be stored.

Co-pending application Ser. No. 10/157,467, filed on May 29, 2002 describes the use of certain acid gas resistant molecular sieves to reduce or remove moisture from fluid compositions comprising a sulfur-containing compound. There is no disclosure or suggestion, however, for the passivation of containers adapted to contain the moisture-reduced compositions. Such containers may have moisture adhered to the internal surfaces, which can and does react with acid gases, reducing their stability and shelf-life.

A second, related problem involves the containers that the reactive gas standards are stored in. If metal or metal lined, reactive gases will react with and/or become adsorbed onto the metal, and will ultimately change the concentration of the reactive gas.

Grossman et al. (U.S. Pat. No. 4,082,834) describes alloys, such as alloys of nickel, titanium, and zirconium, that react with water and reactive gases (such as hydrogen, hydrogen-containing compounds such as hydrocarbons, carbon monoxide, carbon dioxide, oxygen, and nitrogen) at temperatures ranging from about 200° C. to about 650° C. While the patent: does not discuss acid gases, it is apparent that hydrogen sulfide, carbonyl sulfide, and mercaptans are hydrogen-containing compounds, so that there would not be any expected benefits using these alloys to remove moisture from these acid gases. While carbondisulfide does not contain hydrogen, and therefore there could be some moisture reduction from a composition comprising carbondisulfide and moisture using these alloys, the high temperature is prohibitive for commercial use.

Tamhankar et al. (U.S. Pat. No. 4,713,224) describes a one-step process for removing minute quantities of impurities from inert gases, where the impurities are selected from the group consisting of carbon monoxide, carbon dioxide, oxygen, hydrogen, water and mixture thereof. The process comprises contacting the gas with a particulate material comprised of nickel in an amount of at least about 5% by weight as elemental nickel and having a large surface area, from about 100 to about 200 $m^2/g$. There is no disclosure of removal of moisture from reactive gases; there is therefore no discussion or suggestion of moisture removal from reactive gases, moisture removal from matrix gases and mixing same to form a standard gas composition.

Tom et al (U.S. Pat. Nos. 4,853,148 and 4,925,646) discloses processes and compositions for drying of gaseous hydrogen halides of the formula HX, where X is selected from the group consisting of bromine, chlorine, fluorine, and iodine. The patent describes the use of, for example, an organometallic compound such as an alkylmagnesium compound, on a support. The halide is substituted for the alkyl functional group. Suitable supports are, alumina, silica, and aluminosilicates (natural or synthetic). However, there is no description or suggestion of reducing or removing moisture from sulfur-containing reactive gases, or of removal of moisture from matrix gases and mixing the reduced moisture gases to form a standard gas. Alvarez, Jr. et al. (U.S. Pat. No. 5,910,292) describes a process and apparatus for removal of water from corrosive halogen gases, using a high silica zeolite, preferably high silica mordenite. The patent describes removing moisture down to less than or equal to 100 ppb water concentration in halogen gases, particularly chlorine- or bromine-containing gases, but once again, there is lacking any teaching of suggestion of standard gas compositions. U.S. Pat. No. 6,183,539 discloses utilizing high sodium, low silica faujasite particles for the adsorption of carbon dioxide and water vapor from gas streams. The disclosed types of gas streams in which this type of high sodium, low silica faujasite crystals can be utilized includes air, nitrogen, hydrogen, natural gas, individual hydrocarbons and monomers, such as ethylene, propylene, 1,3 butadiene, isoprene and other such gas systems. There is no mention of sulfur-containing acid gas purification using the faujasites, or production of standard gas compositions.

U.S. Pat. No. 4,358,627 discloses use of "acid resistant" molecular sieves, such as that known under the trade designation "AW300", for reducing the chloride concentration in chlorinated liquid hydrocarbons that contain an ethylenically unsaturated chlorinated hydrocarbon, water and hydrogen chloride. The method includes providing certain nitrogen-containing compounds in the system and contacting the system with the molecular sieve. There is no disclosure or suggestion, however, of removal or reduction of moisture from gas phase compositions, or production of standard gas compositions.

With respect to sulfur compounds, one impetus for measurement of low levels of these compounds has come from the hydrocarbon process industry where the requirement for lower sulfur measurements is steadily increasing. Controlling the concentration of sulfur is quite important for two major reasons. First, low sulfur content in simple olefin feed stock for high purity linear polymers such as polyethylene and polypropylene is quite important. Sulfur compounds adsorb onto the surface of the catalysts and prevent the desired reactants from reaching the catalytic surface thereby deactivating the catalyst. Given the quantity of these products produced annually, the economic impact can be quite significant. Therefore, common sulfur impurities in the feed stock, such as $H_2S$ (hydrogen sulfide) and COS (carbonyl sulfide) must be carefully monitored.

Second, sulfur in the form of sulfur dioxide ($SO_2$), has been classified as a criteria pollutant by the EPA. This translates into strict regulation of emissions from coal burning plants, motor vehicle emissions, and paper and wood pulp processing plants to name a few. Sulfur in coal and gasoline becomes sulfur dioxide when the fuel is combusted. This $SO_2$ is a precursor to acid rain. Reducing sulfur in gas not only lowers sulfur dioxide emissions but also reduces catalytic converter poisoning. This increases a vehicle's pollution control efficiency thus reducing other pollutants.

In order to monitor, control and regulate these compounds and other reactive gases, calibration gas mixtures containing these compounds must be used. For these mixtures to be utilized successfully, they must be reliable with respect to stability (shelf life) and concentration. Significant challenges arise as the concentrations of reactive gas mixtures required to calibrate equipment are decreased. Interactions on the cylinder and tubing surfaces, such as chemical reactions and adsorption, are often insignificant with reactive gas concentrations in the range of 10 ppm and above. These interactions become quite important with reactive gases at concentrations at or below 1 ppm. Impurities, such as moisture, which are present in the source gas can also play a major role in the stability of these mixtures.

Given the problem of moisture reacting with acid gases and reactive gases in general, it would be advantageous if passivation methods could be provided which increase the shelf-life during the storage of these compounds.

SUMMARY OF THE INVENTION

In accordance with the present invention, articles of manufacture containing increased stability low concentration gases and methods of making and using the same are provided in order to enhance the stability of low concentration acid gas compositions within the articles over time.

A first aspect of the invention relates to an article of manufacture comprising:
a) a container having an internal space and a passivated internal metal surface; and
b) a composition comprising an acid gas and a balance gas contained within the internal space and in contact with the passivated internal metal surface; wherein
  i) the acid gas has a concentration in the balance gas of less than 500 ppb;
  ii) the acid gas is selected from the group consisting of carbon disulfide, carbonylsulfide, and compounds within formula (I):

$$Y\text{---}S\text{---}X \quad (I)$$

wherein S is sulfur, X and Y are the same or different and are independently selected from the group consisting of hydrogen, alkyl, aryl, oxygen, hydoxyl, amine, aminosilane, oxygen, and alcohol; and
  iii) the passivated internal metal surface comprises A) the reaction product of a silicon-containing material and an oxygen-containing material and B) the acid gas adsorbed on or in the passivated internal metal surface in an amount effective to enhance the stability of the intended concentration over time.

A second aspect of the invention is a method of making an article of manufacture containing an acid gas having an intended concentration which is stably maintained over time, the method comprising the steps of:

exposing an internal metal surface of a container to a first composition comprising one or more silicon-containing compounds for a time sufficient to allow at least some of the silicon-containing compound(s) to react with oxygen-containing compounds present to form a silicon-treated surface on at least some of the internal metal surface, the silicon-containing compound(s) selected from the group consisting of compounds within the general formula (II):

$$SiR^1R^2R^3R^4 \quad (II)$$

wherein R1, R2, R3, and R4 are the same or different and are independently selected from the group consisting of hydrogen, halogen, alkyl, aryl, amine, halogenated alkyl, and halogenated aryl;

evacuating the container for a time sufficient to remove substantially all of the silicon-containing compound(s) that has not reacted with the oxygen-containing compound to form the silicon-treated surface;

exposing the silicon-treated surface to a second composition comprising an acid gas having a concentration that is greater than an intended concentration of the acid gas;

evacuating the container for a time sufficient to remove an amount of the second composition to enhance the stability of the intended concentration over time; and filling the container with a third composition comprising the acid gas at the intended concentration.

A third aspect of the invention is a method of calibrating a measurement device for measuring a concentration of an acid gas, the method comprising the steps of:

providing a manufactured product comprising:
  i) a container having an internal space and a passivated internal metal surface; and
  ii) a composition comprising an acid gas and a balance gas contained within the internal space and in contact with the passivated internal metal surface; wherein
    A) the acid gas has an intended concentration of less than 500 ppb;
    B) the acid gas is selected from the group consisting of carbon disulfide, carbonylsulfide, and compounds within formula (I):

$$Y\text{---}S\text{---}X \quad (I)$$

wherein S is sulfur, X and Y are the same or different and are independently selected from the group consisting of hydrogen, alkyl, aryl, oxygen, hydoxyl, amine, aminosilane, oxygen, and alcohol; and C) the passivated internal metal surface comprises I) the reaction product of a silicon-containing material and an oxygen-containing material (preferably selected from the group consisting of moisture, molecular oxygen, metal oxides, and mixtures thereof), and II) the acid gas adsorbed on or in the passivated internal metal surface in an amount effective to enhance the stability of the intended concentration over time; and using a portion of the acid gas contained within the manufactured product in a calibration of the measurement device; and repeating said step of using a portion at least once, wherein a period of time commencing from a first performance of said step of using a portion and expiring on a later repetition of said step of using a portion is not less than 30 days.

Further aspects and advantages of the invention will become apparent by reviewing the description of preferred embodiments that follow.

DESCRIPTION OF PREFERRED EMBODIMENTS

Figure 1:
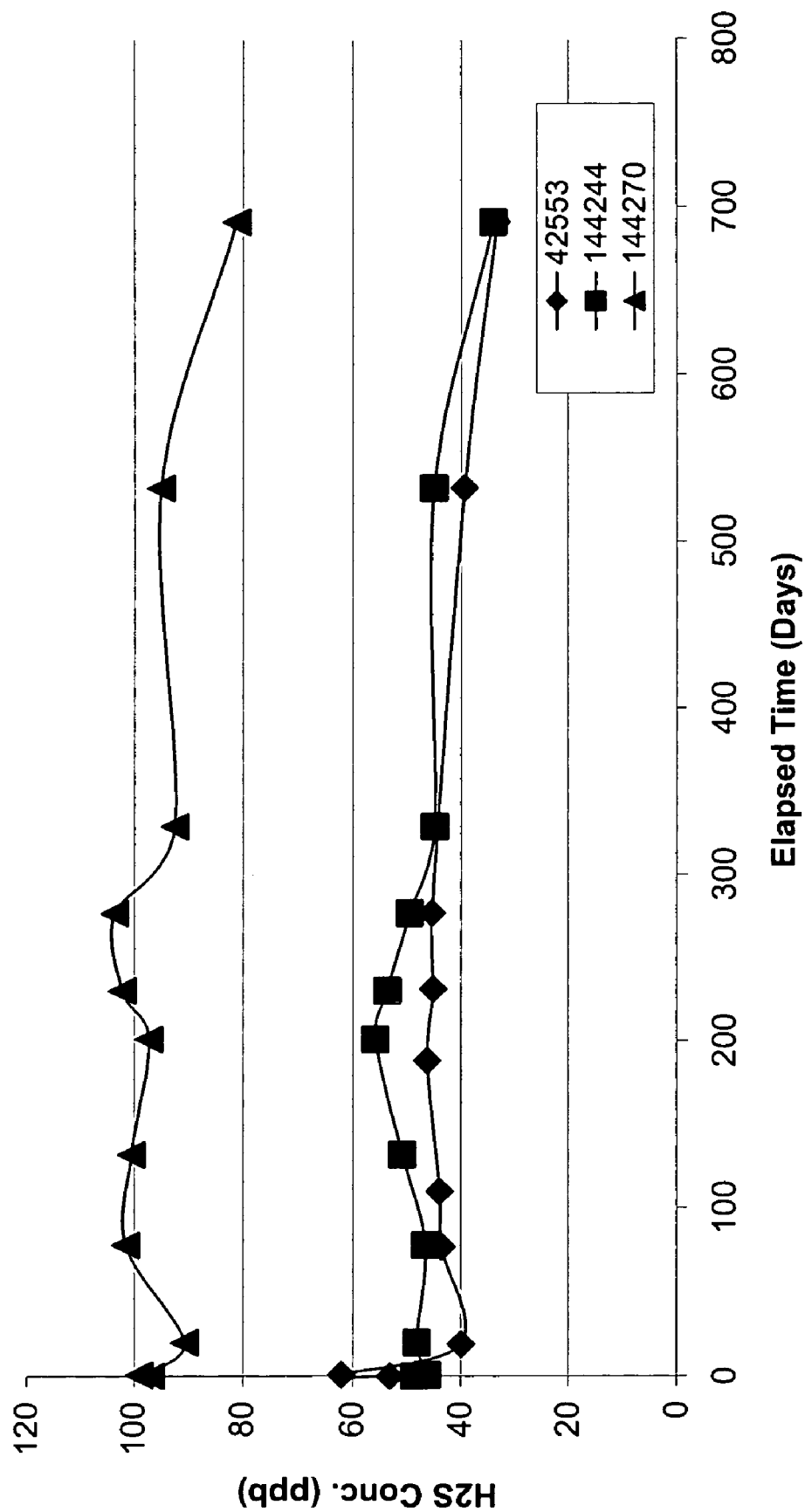
FIG. 1 shows the stability of $H_2S$ concentration in low-level $H_2S$ standards over time.

While the following discussion focuses on a container which has a metal internal surface, the description is not limited thereto, and could apply to a piping or tubing system, a manifold, a gas cylinder having a cylinder valve, ton unit, and the like.

Initially, it is preferred to start with an abraded internal metal surface which has been vacuum baked prior to the reaction of the organosilane with oxygen-containing compounds.

The internal surface of the container, or the surface to be treated, may be subject to abrasion prior to reaction of the silicon-containing compound with oxygen-containing compounds in order to improve adhesion of the reaction product to the metal. Typical abrasion techniques may be found in copending non-provisional patent application Ser. No. 10/157,466, filed May 29, 2002, now published as U.S. 2003/0017359 A1.

The preferred vacuum baking step is typically, this is performed at a temperature of from about 30° C. to about 75° C., a duration of time of no less than 1 hour (preferably no less than 4 hours, even more preferably no less than 6 hours, and still more preferably no less than 12 hours), and a vacuum of no more than 100 torr (preferably no more than 1 torr and more preferably no more than 0.01 torr).

The internal metal surface is then subjected to the reaction between the silicon-containing compound and the oxygen-containing compound.

Silicon-containing compounds within the general formula (II) are known to react with oxygen-containing compounds, such as $H_2O$, $N_2O$, $CO_2$, and the like, to produce $SiO_2$, especially when the silicon-containing compounds are in the gaseous or vapor state.

$$SiR^1R^2R^3R^4 \quad (II)$$

This fact is taken advantage of in the practice of the various aspects of the invention. The reaction product of a silicon-containing compound and an oxygen-containing compound such as water forms an amorphous or crystalline glassy material on the surfaces on which it is deposited. The amorphous or crystalline glassy material may include aluminum silicide, if the container or surface being treated comprises aluminum. Although the deposited material is referred top herein as a "coating", it shall be readily understood that in fact the material may deposit non-uniformly, or not at all on certain areas of the surface being treated. This coating then serves the function of deactivating a surface for the adsorption of molecules of the gas that is ultimately to be contained in the container or piping system at low concentration. In other words, the coating serves to decrease the number of reactive sites on the metal surface being treated. For simplicity, silicon-containing compounds within formula (II) shall be referred to as organosilanes, although their formal name under IUPAC convention may differ.

The reaction of an organosilane within general formula (II) with oxygen-containing materials such as water proceeds without catalyst at room temperature (25° C.); however, it is preferred to carry out the reaction at moderately elevated temperatures, such as temperature ranging from 25° C. up to 100° C., in order to produce the coatings in reasonable time. Most preferably, the temperature is maintained at not more than 74° C. The pressure of the reaction of an organosilane with water vapor will generally also proceed at atmospheric pressure, however, the pressure in the container, or near the surface being treated, may either be in vacuum or above atmospheric pressure. This will of course depend on the rates of reaction of the organosilane with the oxygen-containing compound, the desired coating deposition rate, and desired thickness of the coating. It is of course within the invention to make layered coatings of two or more organosilane/oxygen-containing compound reaction products. It is also considered within the invention to employ two or more organosilanes simultaneously to make a "mixed" coating. Indeed, it is possible that the organosilane may be employed in conjunction with a non-organosilane to form either layered or mixed coatings.

Silane and organosilanes are toxic materials, and, depending on the organosilane, pyrophoric. Special care in handling these materials is warranted, preferably well-ventilated hoods. Electronic grade silane ($SiH_4$) is available commercially in cylinders from Air Liquide America Corporation, Houston, Tex. Trimethylsilane is available commercially from Dow Corning Corporation.

Preferred silicon-containing compounds include silane, and methyl-containing organosilanes; particularly those wherein the methyl-containing organosilane is selected from the group consisting of methylsilane, dimethylsilane, trimethylsilane and tetramethylsilane. Preferred organosilane compounds include methylsilane compounds having the structure $SiH_n(CH_3)_{4-n}$, where n=1 to 3, i.e. methylsilane, dimethylsilane, or trimethylsilane or the structure $Si_2H_m(CH3)_{6-m}$, where m=1 to 5. The most preferred organosilane compound is methylsilane, $CH_3SiH_3$. The organosilane compounds are hydrolyzed by reaction with water, oxygen or water-containing gases such as humid air and/or other oxygen-containing gases, such that the carbon content of the deposited film is from 1 to 50% by atomic weight, preferably about 20%.

It is conceivable to employ adjuvants during the reaction of an organosilane with water. In the practice of the invention, "adjuvant" includes physical and chemical adjuvants, and combinations thereof. Suitable physical adjuvants include electrostatic discharge, plasma discharge, laser excitation, and the like, under temperatures and pressures suitable for each of these processes. For example, plasmas are preferably best employed in moderate vacuum. A chemical adjuvant might include an oxidant gas such as oxygen, ozone, chlorine dioxide, combinations thereof, and the like. When a combination of physical and chemical adjuvants is employed, for example ozone and plasma discharge, the reaction product may be described as similar to the films produced b the process described in U.S. Pat. No. 6,054,379, which is incorporated herein by reference for its teaching of the production of such films.

Preferably, the silicon-containing composition is % 1 Silane in $N_2$ and is maintained at 100 psig for 1 day during which it reacts with any oxygen-containing compounds present, such as moisture or air.

The container or surface to be treated may be selected from the group consisting of iron, stainless steel (for example 301, 316, 401), aluminum, aluminum alloy, steel alloys and the like.

Once the metal container inner surface, or metal surface to be treated, is cleaned, and the reaction of organosilane with oxygen-containing compounds completed (either with or with out adjuvants) to form a coating, the processes of the invention include evacuating the container for a time and vacuum sufficient to remove substantially all silicon-containing compound(s) that has not reacted with oxygen-containing compounds. This first evacuation step preferably includes evacuation down to a vacuum of about 1 torr, more preferably down to 0.01 torr. The temperature during this evacuation process is not critical, but higher temperatures may tend to increase the removal rate of organosilane. This will be balanced by safety issues, in that higher temperatures may be more hazardous. Therefore, room temperature (about 25° C.), or slightly lower or slightly higher than room temperature is preferred. After the vacuum step is performed, it is followed by a N2 fill step.

Subsequent to this first evacuation step, the next step is exposing the coating to a gas composition, the gas composition having a concentration of an acid gas that is greater than an intended acid gas concentration of a manufactured product. The acid gas is caused to contact the coating and deactivate the surface even further. The acid gas preferably has a concentration of at least 10 times the concentration of the acid gas that is to be stored in the container or exposed to the surface, more preferably has a concentration 50 times greater than the concentration of the acid gas that is to be stored in the container, still more preferably 500 times greater than the ultimate concentration, and even still more preferably 50,000 times the concentration of the acid gas to be stored in the container. When $H_2S$ is selected as the acid gas, it is preferred to perform this step using 5000 ppm $H_2S$ in $N_2$ at 100 psig.

Typical acid gases in include carbon disulfide, carbonylsulfide, and compounds within formula (I):

$$Y-S-X \quad (I)$$

wherein S is sulfur, X and Y are the same or different and are independently selected from the group of hydrogen, alkyl, aryl, oxygen, hydoxyl, amine, aminosilane, oxygen, and alcohol.

Examples of preferred sulfur-containing compounds within formula (I) include hydrogen sulfide, carbonyl sulfide, sulfur dioxide, methylthiol, ethylthiol, n-propylthiol, i-propylthiol, benzylthiol, and the like. Especially preferred sulfur-containing compunds within formula (I) include hydrogen sulfide, carbonyl sulfide and sulfur dioxide.

The degree of adsorption of the acid gas onto the coating depends in a complicated way on the composition and physical properties of the coating, the temperature and pressure employed during this step, as well as on the chemical and physical properties of the particular acid gas that is being adsorbed thereon. These parameters are in turn dictated by the final concentration of acid gas that is to be stored in the container. A discussion of adsorption of gaseous species onto surfaces that is helpful in this respect is included in Daniels, F. et al., "Experimental Physical Chemistry", Seventh Edition, McGraw-Hill, pages 369-374 (1970). While the inventors are not certain, it is believed that the attraction of the acid gas to the coating is physical in nature, involving an interaction of dipoles or induced dipoles, but may be chemical in nature involving chemical bonds, as when oxygen is adsorbed on charcoal. A combination of physical and chemical forces may be at work as well. Thus, the surface area of a coating produced by the practice of the present invention may be determined by the B.E.T. method, and preferably is at least about 1 $m^2$/gram, more preferably at least 10 $m^2$/gram. If the coating is somewhat porous, the pore volume may be determined by nitrogen adsorption isotherm methods, and is preferably at least 0.1 ml/gram. The B.E.T. method is described in detail in Brunauer, S. Emmet, P. H., and Teller, E., J. Am. Chem. Soc., 60, 309-16 (1938). The nitrogen adsorption isotherm method is described in detail in Barrett, E. P., Joyner, L. G. and Helenda, P. P., J. Am. Chem. Soc., 73, 373-80 (1951), incorporated by reference herein. In general, if the concentration of acid gas to be stored in the container is 100 ppb, then for the same acid gas, same temperature and pressure, and same coating, the concentration of acid gas used in this step will be higher than if the ultimate concentration of acid gas is to be only 50 ppb, assuming adsorption is the governing pathway. An increase in temperature will tend to require an increase in concentration of acid gas, an increase in pressure, or both, to achieve the same degree of adsorption. In contrast, a decrease in temperature will tend to require a decreased concentration of acid gas, a decrease in pressure, or both to achieve the same level of adsorption.

After the surface has been further deactivated by exposure to the acid gas at high concentration, a second evacuation step is carried out to remove excess acid gas. In this step, evacuation of the container is carried out for a time sufficient to remove substantially all of non-adsorbed acid gas, leaving acid gas adsorbed on the coating. Once the metal container inner surface, or metal surface to be treated, is cleaned, and the reaction of organosilane with oxygen-containing compounds completed (either with or with out adjuvants) to form a coating, the processes of the invention include evacuating the container for a time and vacuum sufficient to remove substantially all silicon-containing compound(s) that has not reacted with oxygen-containing compounds. Preferably, this step is performed down to a vacuum of about 1 torr, more preferably down to 0.01 torr. The temperature during this evacuation process is not critical, but higher temperatures may tend to increase the removal rate of organosilane. This will be balanced by safety issues, in that higher temperatures may be more hazardous. Therefore, room temperature (about 25° C.), or slightly lower or slightly higher than room temperature is preferred. After the vacuum step is performed, it is followed by a N2 fill step.

When $SO_2$ is selected as the acid gas, steps in addition to the foreoing are preferable and include the following. After completion of the reaction between the silicon-containing and oxygen-containing compounds, but before the vacuum and N2 fill step, the cylinder is subjected to five cycles of being filled with Nitrogen at 100 psi followed by venting. Similarly, after completion of the exposure of the internal cylinder surface to $SO_2$ (the selected acid gas), but before the vacuum and N2 fill step, the treated cylinder is again subjected to five cycles of being filled with Nitrogen at 100 psi followed by venting.

The container is then filled with a gas composition comprising the intended low concentration of acid gas in the balance gas. While preferred manufactured products of the invention comprise only a single acid gas with one balance gas, two or more acid gases and/or two or more balance gases may be used. Typical balance gases include noble gases, nitrogen, ethylene, propylene, and mixtures thereof.

As shown below in the Examples, application of the method of the invention to acid gases having concentrations below 500 ppb exhibits unexpectedly good stability. The unexpected stability is even more surprising as the concentration utilized ranges from about 50 ppb to about 100 ppb.

EXAMPLES

In the following examples, hydrogen sulfide concentrations were measured using a chemluminescence detector.

Examples 1-3

In order to betatest the process of the invention in a production environment, a betatest was performed at a specialty gas fill plant located in Santa Fe Springs, Calif. All cylinders were kept and analyzed on site for approximately one month and then transferred to a laboratory and maintained there for further analysis.

Each of the cylinders were treated as follows:
Step 1 (Vacuum Bake): Cylinders go through a vacuum/fill bake cycle for a minimum of 4 hours
Step 2 (Silane Passivation): Cylinders attached to manifold and vacuumed. Cylinders filled with 1% Silane in $N_2$ to 100 psig and maintained for 1 day. Manifold vented and vacuumed.
Step 3 (Silane Removal and $H_2S$ Passivation): Cylinders attached to manifold and vented. Cylinders go through a vacuum/$N_2$ fill cycle. Vacuumed cylinders filled with 5000 ppm $H_2S$ in $N_2$ to 100 psig and maintained for 4 days. Manifold vented through a scrubber and vacuumed.
Step 4 ($H_2S$ Removal): Cylinders attached to manifold and vented out through scrubber. Cylinders go through a vacuum/$N_2$ fill cycle. Cylinders vacuumed for at least 2 hours.
Step 5 (Standard Filling): Cylinders filled to target concentration from a 10 ppm mother mixture in Nitrogen.

TABLE 1

Cylinder Size and Fill Concentration

| Example | Cylinder # | Size | $H_2S$ Fill Concentration (ppb) |
|---|---|---|---|
| 1 | 42553 | 16 | 53.1 |
| 2 | 144244 | 30 | 48.5 |
| 3 | 144270 | 30 | 96.9 |

TABLE 2

$H_2S$ Concentration Over Time for Examples 1-3

| Example 1: Cyl. # 42553 | | Example 2: Cyl. # 144244 | | Example 3: Cyl. # 144270 | |
|---|---|---|---|---|---|
| days | ppb $H_2S$ | days | ppb $H_2S$ | days | ppb $H_2S$ |
| 0 | 53.1 | 0 | 48.5 | 0 | 96.9 |
| 1 | 62 | 1 | 46.1 | 1 | 99 |
| 19 | 39.9 | 20 | 48.1 | 20 | 90.7 |
| 77 | 43.5 | 78 | 46.51 | 78 | 101.57 |
| 110 | 43.9 | 132 | 50.8 | 132 | 100.5 |
| 188 | 46.2 | 201 | 55.8 | 201 | 97.3 |
| 231 | 45.1 | 230 | 53.6 | 230 | 102.2 |
| 277 | 45.3 | 277 | 49.4 | 277 | 103.6 |
| 532 | 39.3 | 329 | 44.8 | 329 | 92.5 |
| 691 | 33.2 | 532 | 44.9 | 532 | 95 |
|  |  | 691 | 33.9 | 691 | 81.1 |

As best illustrated in FIG. 1, the $H_2S$ concentration for Examples 1-3 is stable over an approximate 700 day period of time.

Examples 4-7 and Comparative Examples 1-7

Examples 4-7 were prepared as follows:
Step 1 (Vacuum Bake): Cylinders go through a vacuum/fill bake cycle for a minimum of 4 hours
Step 2 (Silane Passivation): Cylinders attached to manifold and vacuumed. Cylinders filled with 1% Silane in $N_2$ to 100 psig and maintained for the time indicated in Table 3. Manifold vented and vacuumed.
Step 3 (Silane Removal and $H_2S$ Passivation): Cylinders attached to manifold and vented. Cylinders go through a vacuum/$N_2$ fill cycle. Vacuumed cylinders filled with 5000 ppm $H_2S$ in $N_2$ to 100 psig and maintained for the time indicated in Table 3. Manifold vented through a scrubber and vacuumed.
Step 4 ($H_2S$ Removal): Cylinders attached to manifold and vented out through scrubber. Cylinders go through a vacuum/$N_2$ fill cycle. Cylinders vacuumed for at least 2 hours.
Step 5 (Standard Filling): Cylinders filled to target concentration from a 10 ppm mother mixture in Nitrogen.

Comparative Examples 1-3 and 7 were prepared as follows:
Step 1 (Vacuum Bake): Cylinders go through a vacuum/fill bake cycle for a minimum of 4 hours
Step 2 (Silane Passivation): Cylinders attached to manifold and vacuumed. Cylinders filled with 1% Silane in $N_2$ to 100 psig and maintained for the time indicated in Table 3. Manifold vented and vacuumed.
Step 3 (Silane Remova): Cylinders attached to manifold and vented. Cylinders go through a vacuum/$N_2$ fill cycle. Cylinders vacuumed for at least 2 hours.

Comparative Examples 4-6 were prepared as follows:
Step 1 (Vacuum Bake): Cylinders go through a vacuum/fill bake cycle for a minimum of 4 hours
Step 2 ($H_2S$ Passivation): Cylinders filled with 5000 ppm $H_2S$ in $N_2$ to 100 psig and maintained for the time indicated in Table 3. Manifold vented through a scrubber and vacuumed.
Step 3 ($H_2S$ Removal): Cylinders attached to manifold and vented out through scrubber. Cylinders go through a vacuum/$N_2$ fill cycle. Cylinders vacuumed for at least 2 hours.
Step 4 (Standard Filling): Cylinders filled to target concentration from a 10 ppm mother mixture in Nitrogen.

TABLE 3

Cylinder Size, Silane and $H_2S$ Passivation Periods, and Fill Concentrations

| | Cylinder # | Cylinder Size | Silane (days) | $H_2S$ (days) | $H_2S$ Fill conc. (ppb) |
|---|---|---|---|---|---|
| Comp. Ex. 1 | 24271 | Size 7 | 94 | 0 | 101.2 |
| Comp. Ex. 2 | 24283 | Size 7 | 29 | 0 | 101.2 |
| Comp. Ex. 3 | 24287 | Size 7 | 96 | 0 | 101.2 |
| Comp. Ex. 4 | 24235 | Size 7 | 0 | 42 | 101.2 |
| Comp. Ex. 5 | 24305 | Size 7 | 0 | 39 | 105.0 |
| Comp. Ex. 6 | 24313 | Size 7 | 0 | 39 | 105.0 |
| Ex. 4 | 24335 | Size 7 | 35 | 14 | 105.0 |
| Comp. Ex. 7 | 15042 | Size 30 | 61 | 0 | 76.4 |
| Ex. 5 | 15031 | Size 30 | 27 | 30 | 104.0 |
| Ex. 6 | 15035 | Size 30 | 27 | 30 | 104.0 |
| Ex. 7 | 15039 | Size 30 | 8 | 57 | 76.4 |

TABLE 4

$H_2S$ Concentration Over Time for Comparative Examples 1-6

| Comp. Ex. 1: Cyl. # 24271 | | Comp. Ex. 2: Cyl. # 24283 | | Comp. Ex. 3: Cyl. # 24287 | | Comp. Ex. 4: Cyl. # 24235 | | Comp. Ex. 5: Cyl. # 24305 | | Comp. Ex. 6: Cyl. # 24313 | |
|---|---|---|---|---|---|---|---|---|---|---|---|
| days | ppb $H_2S$ | days | ppb $H_2S$ | days | ppb $H_2S$ | days | ppb $H_2S$ | days | ppb $H_2S$ | days | ppb $H_2S$ |
| 0 | 101.2 | 0 | 101.2 | 0 | 101.2 | 0 | 101.2 | 0 | 90 | 0 | 91 |
| 8 | 102.6 | 8 | 91.7 | 8 | 108.8 | 1 | 86.37 | 2 | 91.7 | 2 | 97.5 |
| 15 | 77.34 | 15 | 82 | 15 | 73.8 | 5 | 90.7 | 6 | 87 | 6 | 97.2 |
| 23 | 92.1 | 23 | 58 | 23 | 81.3 | 6 | 84.9 | 28 | 81.67 | 28 | 97 |
| 43 | 80.6 | 43 | 47.6 | 43 | 73.1 | 7 | 92.4 | 45 | 79.1 | 45 | 97.1 |
| 49 | 69.9 | 49 | 42.5 | 49 | 66.1 | 9 | 87.3 | 49 | 74 | 49 | 81.8 |
| 74 | 81.3 | | | 74 | 76.3 | 13 | 84.3 | 57 | 68.2 | 57 | 94.1 |
| 101 | 76.7 | | | 101 | 67.7 | 14 | 87.1 | 77 | 60.1 | 77 | 86.6 |
| 150 | 75 | | | 150 | 69 | 22 | 93 | 83 | 58.7 | 83 | 81.2 |
| 239 | 72.2 | | | 163 | 63.4 | 33 | 83.2 | 108 | 71.2 | 108 | 100.7 |
| 296 | 61.8 | | | 239 | 64.8 | 36 | 95.4 | 135 | 67.2 | 135 | 101.8 |
| 319 | 65.7 | | | 296 | 52 | 40 | 100.8 | 184 | 66.3 | 184 | 99.1 |
| 490 | 36.2 | | | 319 | 59.1 | 61 | 89.1 | 197 | 62.2 | 197 | 100.8 |
| | | | | 490 | 21.7 | 78 | 84.3 | 273 | 56.9 | 273 | 101.8 |
| | | | | | | 81 | 82.4 | 524 | 13.9 | 330 | 96.3 |
| | | | | | | 89 | 84.6 | | | 524 | 65.5 |
| | | | | | | 109 | 76.4 | | | 665 | 48.4 |
| | | | | | | 115 | 74.53 | | | | |
| | | | | | | 140 | 86.9 | | | | |
| | | | | | | 167 | 83.2 | | | | |
| | | | | | | 216 | 87.3 | | | | |
| | | | | | | 229 | 80.3 | | | | |
| | | | | | | 362 | 69.7 | | | | |
| | | | | | | 385 | 66.4 | | | | |
| | | | | | | 447 | 59.6 | | | | |

TABLE 5

$H_2S$ Concentration Over Time for Examples 4-7 & Comparative Example 7

| 24335 | | 15031 | | 15035 | | 15039 | | 15042 | |
|---|---|---|---|---|---|---|---|---|---|
| days | ppb $H_2S$ | days | ppb $H_2S$ | days | ppb $H_2S$ | days | ppb $H_2S$ | days | ppb $H_2S$ |
| 0 | 87 | 0 | 104 | 0 | 104 | 0 | 76.4 | 0 | 76.4 |
| 2 | 97.7 | 9 | 108.8 | 9 | 108.9 | 1 | 79.4 | 1 | 74.2 |
| 6 | 101 | 15 | 97.2 | 15 | 96 | 8 | 65.4 | 8 | 61.4 |
| 28 | 105.5 | 23 | 96.8 | 23 | 100.5 | 9 | 72.8 | 9 | 59.2 |
| 45 | 96.4 | 43 | 91.2 | 43 | 97 | 29 | 73 | 29 | 52.1 |
| 49 | 99.4 | 44 | 103.6 | 44 | 112.6 | 30 | 71.6 | 30 | 55.3 |
| 57 | 100.2 | 49 | 86 | 49 | 89.2 | 35 | 66.6 | 35 | 50.5 |
| 77 | 87 | 50 | 93 | 50 | 98.8 | 36 | 73.1 | 36 | 48.3 |
| 83 | 90.2 | 52 | 100.7 | 52 | 102 | 38 | 76.6 | 38 | 51.5 |
| 108 | 103.1 | 67 | 96.1 | 67 | 100 | 44 | 70.6 | 53 | 39.5 |
| 135 | 105.2 | 74 | 92.2 | 74 | 95.1 | 53 | 73.5 | 60 | 39.7 |
| 184 | 109.1 | 91 | 90.2 | 91 | 92.9 | 60 | 73 | 77 | 38.3 |
| 197 | 103.9 | 92 | 94 | 92 | 95 | 77 | 65 | 78 | 41.9 |
| 273 | 109.9 | 114 | 91.1 | 114 | 93.7 | 78 | 71.1 | 100 | 36.3 |
| 330 | 108 | 127 | 95.7 | 127 | 102.6 | 100 | 72.2 | 113 | 41.9 |
| 353 | 131.2 | 150 | 102.4 | 150 | 102.2 | 113 | 78.4 | 136 | 40 |
| 415 | 123.3 | 183 | 97.8 | 183 | 94.3 | 136 | 78.1 | 169 | 35.4 |
| 518 | 114.1 | 238 | 97.6 | 238 | 103.9 | 169 | 73.2 | 224 | 33.8 |
| 562 | 112.3 | 287 | 93.8 | 284 | 93.9 | 224 | 79.5 | 270 | 25.1 |

TABLE 5-continued

H$_2$S Concentration Over Time for Examples 4-7 & Comparative Example 7

| 24335 | | 15031 | | 15035 | | 15039 | | 15042 | |
|---|---|---|---|---|---|---|---|---|---|
| days | ppb H$_2$S | days | ppb H$_2$S | days | ppb H$_2$S | days | ppb H$_2$S | days | ppb H$_2$S |
| 660 | 104.4 | 381 | 99.6 | 381 | 111.8 | 270 | 70.1 | 451 | 0 |
| 867 | 109.3 | 491 | 84.7 | 429 | 98.3 | 367 | 76.4 | | |
| 1023 | 102 | 574 | 93.9 | 497 | 95.2 | 477 | 70.8 | | |
| | | 626 | 78 | 574 | 107.2 | 560 | 74.1 | | |
| | | 829 | 86.7 | 626 | 93.9 | 612 | 65 | | |
| | | 989 | 78.2 | 829 | 100.8 | 815 | 70.2 | | |
| | | | | 989 | 87.3 | 975 | 63.3 | | |

Figure 2:
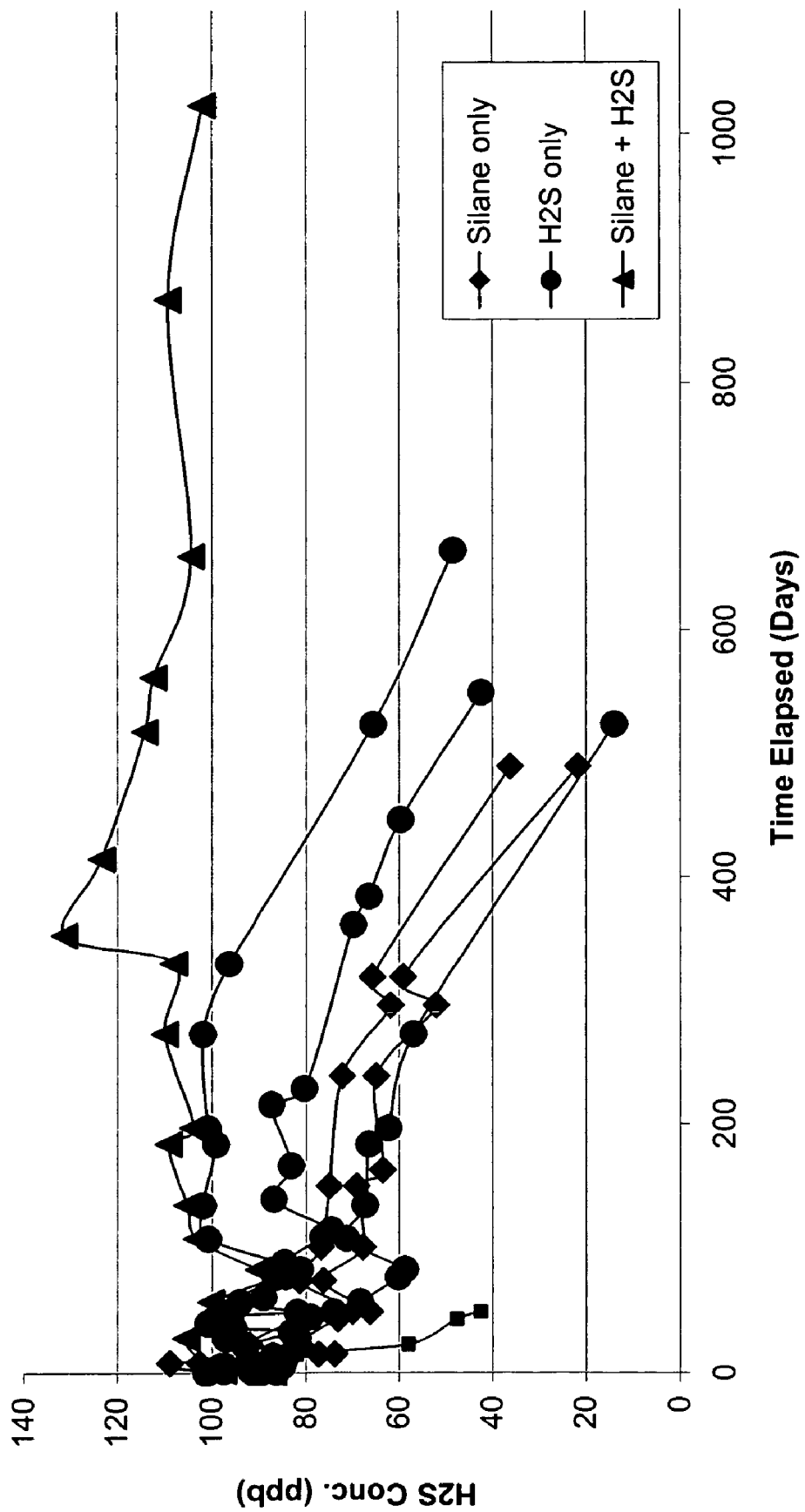
FIG. 2 shows the stability of $H_2S$ concentration in low-level $H_2S$ standards over time.

As best shown in FIG. 2, Example 4 in comparison to only Silane passivation or only H$_2$S passivation (for the same size cylinder) exhibited excellent stability.

Figure 3:
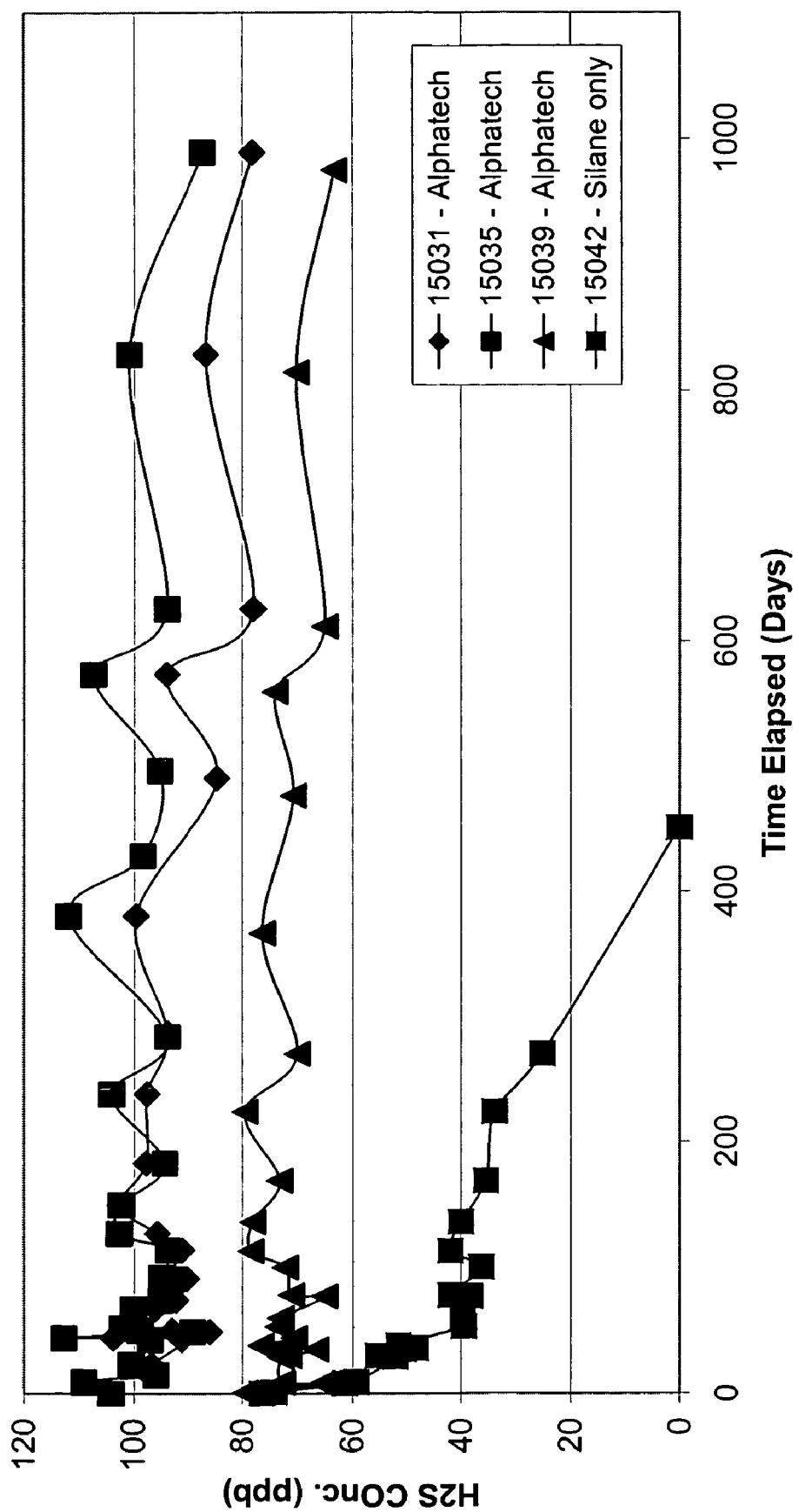
FIG. 3 shows the stability of $H_2S$ concentration in low-level $H_2S$ standards over time.

As best shown in FIG. 3, Examples 5-7 in comparison to only Silane passivation (for the same size cylinder) exhibited excellent stability.

Example 8

In an effort to study the effect of reducing production time to less than two weeks for low-level COS/H$_2$S in Nitrogen mixtures, the passivation times were shortened. A cylinder used for the COS/H$_2$S mixture underwent the following treatment:

Example 8 was prepared as follows:

Step 1 (Vacuum Bake): Size 16 cylinder goes through a vacuum/fill bake cycle for a minimum of 4 hours Step 2 (Silane Passivation): Cylinder attached to manifold and vacuumed. Cylinder filled with 1% Silane in N$_2$ to 100 psig and maintained for 3 days. Manifold vented and vacuumed.

Step 3 (Silane Removal and H$_2$S Passivation): Cylinder attached to manifold and vented. Cylinder goes through a vacuum/N$_2$ fill cycle. Vacuumed cylinders filled with 5000 ppm H$_2$S in N$_2$ to 100 psig and maintained for 8 days. Manifold vented through a scrubber and vacuumed.

Step 4 (H$_2$S Removal): Cylinder attached to manifold and vented out through scrubber. Cylinder goes through a vacuum/N$_2$ fill cycle. Cylinder vacuumed for at least 2 hours.

Step 5 (Standard Filling): Cylinder filled to a concentration 52.1 ppb COS and 49.7 ppb H$_2$S in Nitrogen.

TABLE 6

H$_2$S and COS Concentrations Over Time for Example 8
Example 8: Cylinder # 42589

| days | ppb H$_2$S | ppb COS |
|---|---|---|
| 0 | 49.7 | 52.1 |
| 2 | 59.9 | 52.4 |
| 32 | 50 | 64.4 |
| 38 | 57.9 | 69.9 |
| 114 | 57 | 55.5 |
| 197 | 48.6 | 56.1 |
| 401 | 50.3 | 58.3 |
| 576 | 56.2 | 48.7 |

Figure 4:
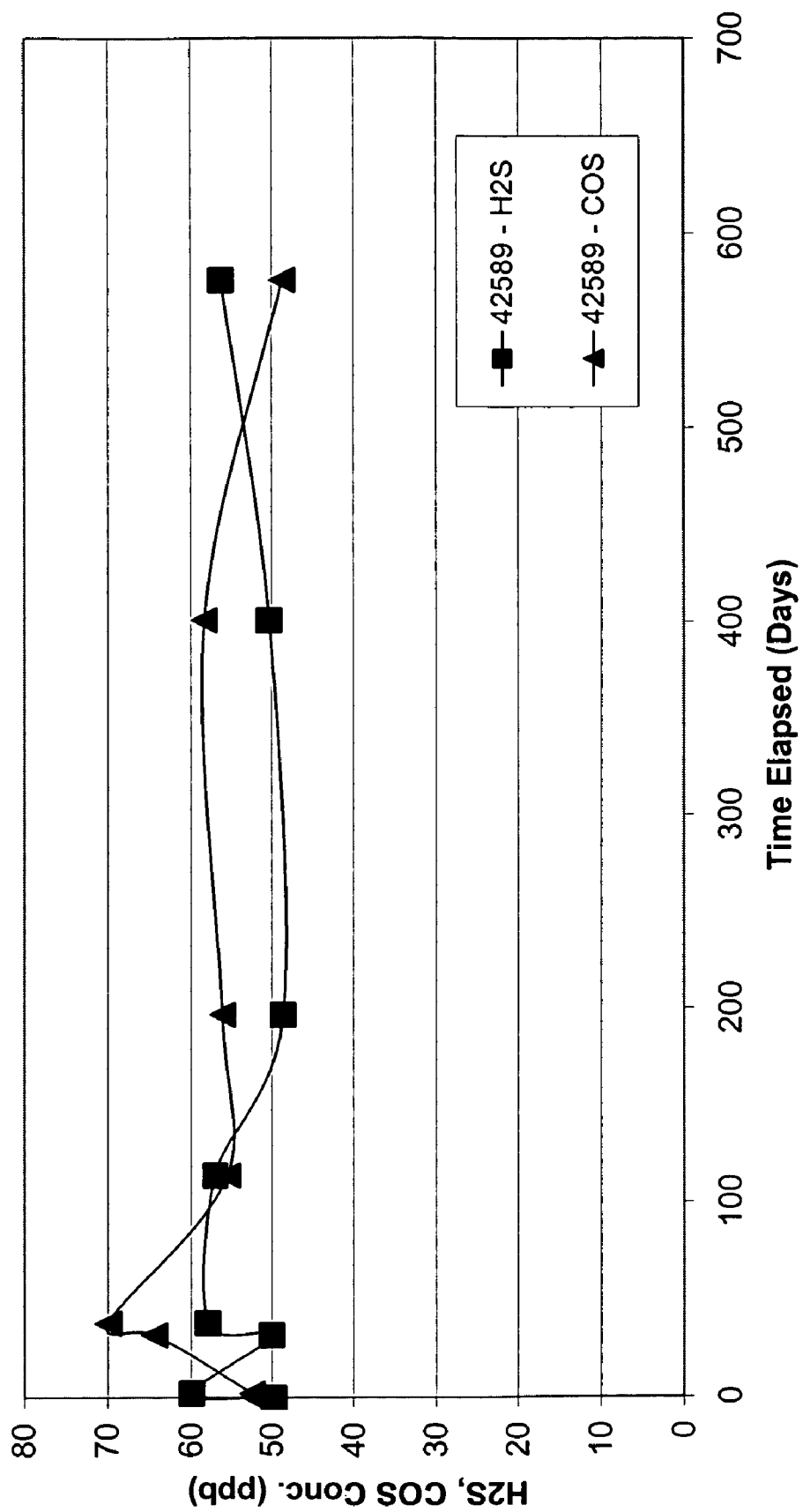
FIG. 4 shows the stability of $H_2S$ and COS concentrations in low-level $H_2S$ and COS standards over time.

As best shown in FIG. 4, Example 8 exhibited excellent stability.

Examples 9-11

The invention was also tested for H$_2$S and COS mixtures in balance Ethylene at approximate concentrations of about 100 ppb. Two Ethylene grades were tested as the balance gas: 99.95% (CP grade) and 99.9995% (5N5 grade).

Example 9 was prepared as follows.

Step 1 (Vacuum Bake): Size 7 cylinder goes through a vacuum/fill bake cycle for a minimum of 4 hours Step 2 (Silane Passivation): Cylinder attached to manifold and vacuumed. Cylinder filled with 1% Silane in N$_2$ to 100 psig and maintained for 4 days. Manifold vented and vacuumed.

Step 3 (Silane Removal and H$_2$S Passivation): Cylinder attached to manifold and vented. Cylinder goes through a vacuum/N$_2$ fill cycle. Vacuumed cylinders filled with 5000 ppm H$_2$S in N$_2$ to 100 psig and maintained for 4 days. Manifold vented through a scrubber and vacuumed.

Step 4 (H$_2$S Removal): Cylinder attached to manifold and vented out through scrubber. Cylinder goes through a vacuum/N$_2$ fill cycle. Cylinder vacuumed for at least 2 hours.

Step 5 (Standard Filling): Filled with 106 ppb COS in 5N5 Ethylene.

Example 10 was prepared as follows:

Step 1 (Vacuum Bake): Size 16 cylinder goes through a vacuum/fill bake cycle for a minimum of 4 hours Step 2 (Silane Passivation): Cylinder attached to manifold and vacuumed. Cylinder filled with 1% Silane in N$_2$ to 100 psig and maintained for 3 days. Manifold vented and vacuumed.

Step 3 (Silane Removal and H$_2$S Passivation): Cylinder attached to manifold and vented. Cylinder goes through a vacuum/N$_2$ fill cycle. Vacuumed cylinders filled with 5000 ppm H$_2$S in N$_2$ to 100 psig and maintained for 9 days. Manifold vented through a scrubber and vacuumed.

Step 4 (H$_2$S Removal): Cylinder attached to manifold and vented out through scrubber. Cylinder goes through a vacuum/N$_2$ fill cycle. Cylinder vacuumed for at least 2 hours.

Step 5 (Standard Filling): Filled with 89.5 ppb H$_2$S in CP grade Ethylene.

Example 11 was prepared as follows:

Step 1 (Vacuum Bake): Size 16 cylinder goes through a vacuum/fill bake cycle for a minimum of 4 hours Step 2 (Silane Passivation): Cylinder attached to manifold and vacuumed. Cylinder filled with 1% Silane in N$_2$ to 100 psig and maintained for 3 days. Manifold vented and vacuumed.

Step 3 (Silane Removal and H$_2$S Passivation): Cylinder attached to manifold and vented. Cylinder goes through a vacuum/N$_2$ fill cycle. Vacuumed cylinders filled with 5000 ppm H$_2$S in N$_2$ to 100 psig and maintained for 8 days. Manifold vented through a scrubber and vacuumed.

Step 4 (H$_2$S Removal): Cylinder attached to manifold and vented out through scrubber. Cylinder goes through a vacuum/N$_2$ fill cycle. Cylinder vacuumed for at least 2 hours.

Step 5 (Standard Filling): Filled with 98.8 ppb COS in CP grade Ethylene.

TABLE 7

H$_2$S and COS Concentrations Over Time for Examples 9-11

| Example 9: Cylinder # 27525 | | Example 10: Cylinder # 42573 | | Example 11: Cylinder # 42543 | |
|---|---|---|---|---|---|
| days | ppb COS | days | ppb H$_2$S | days | ppb COS |
| 0 | 106 | 0 | 89.5 | 0 | 98.8 |
| 1 | 131.9 | 2 | 81.4 | 2 | 80.4 |
| 7 | 76.4 | 32 | 111.3 | 38 | 120.6 |
| 23 | 94.7 | 38 | 124.9 | 112 | 119.4 |
| 55 | 109 | 112 | 105.7 | 133 | 109.7 |
| 142 | 113.4 | 130 | 95 | 198 | 98.9 |
| 216 | 108.6 | 193 | 95.8 | 401 | 84.3 |
| 237 | 82.8 | 366 | 85.9 | 576 | 100.5 |
| 302 | 89.7 | 401 | 88.3 | | |
| 680 | 78.6 | 576 | 76.7 | | |

Figure 5:
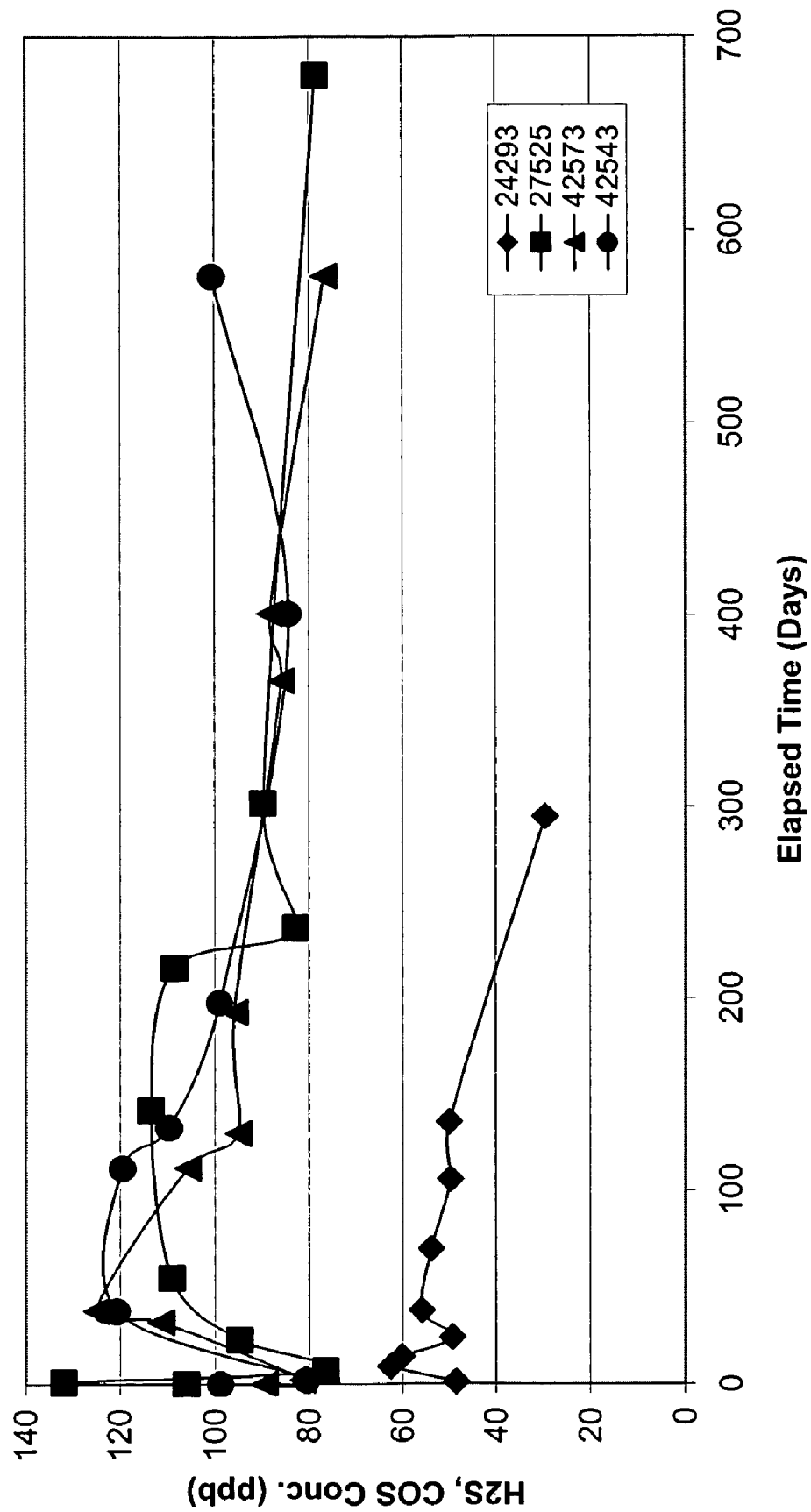
FIG. 5 shows the stability of $SO_2$ concentration in low-level $SO_2$ ndards over time.

As best shown in FIG. 5, Example 9-11 exhibited excellent stability.

Examples 12-13

The cylinder treatment of the invention was performed with an extra step where the cylinder was filled with Nitrogen at 100 psi and vented five times after each passivation with Silane and each passivation with SO$_2$.

Examples 12-13 were prepared as follows:

Step 1 (Vacuum Bake): Cylinder goes through a vacuum/fill bake cycle for a minimum of 4 hours Step 2 (Silane Passivation): Cylinder attached to manifold and vacuumed. Cylinder filled with 1% Silane in N$_2$ to 100 psig and maintained for 43 days.

Step 3 (Silane Removal and SO$_2$ Passivation): Manifold vented and filled with N2 at 100 psig. This was repeated 4 times. Cylinder goes through a vacuum/N$_2$ fill cycle. Vacuumed cylinders filled with 500 ppm SO$_2$ in N$_2$ to 100 psig and maintained for 8 days. Manifold vented through a scrubber and vacuumed.

Step 4 (SO$_2$ Removal): Cylinder attached to manifold vented and filled with N2 at 100 psig. This was repeated 4 times. They were vacuumed and then filled with 100 psi of pure Propylene for 7 days. Cylinder attached to manifold vented and filled with N2 at 100 psig. This was repeated 4 times. Cylinder vacuumed for at least 2 hours.

Step 5 (Standard Filling): Filled with 100 ppb SO$_2$ in Propylene at 100 psi.

TABLE 8

SO$_2$ Concentration Over Time for Examples 12-13

| Example 12: Cylinder # 6513 | | Example 13: Cylinder # 6514 | |
|---|---|---|---|
| days | ppb SO$_2$ | days | ppb SO$_2$ |
| 0 | 100 | 0 | 100 |
| 14 | 71 | 14 | 93 |
| 28 | 113 | 28 | 101 |
| 42 | 73 | 42 | 110 |
| 56 | 88 | 56 | 142 |
| 70 | 104 | 70 | 129 |
| 100 | 102 | 100 | 129 |
| 130 | 112 | 130 | 127 |
| 170 | 108 | 170 | 140 |
| 210 | 105 | 210 | 114 |
| 260 | 98 | 260 | 113 |
| 300 | 97 | 300 | 111 |

Figure 6:
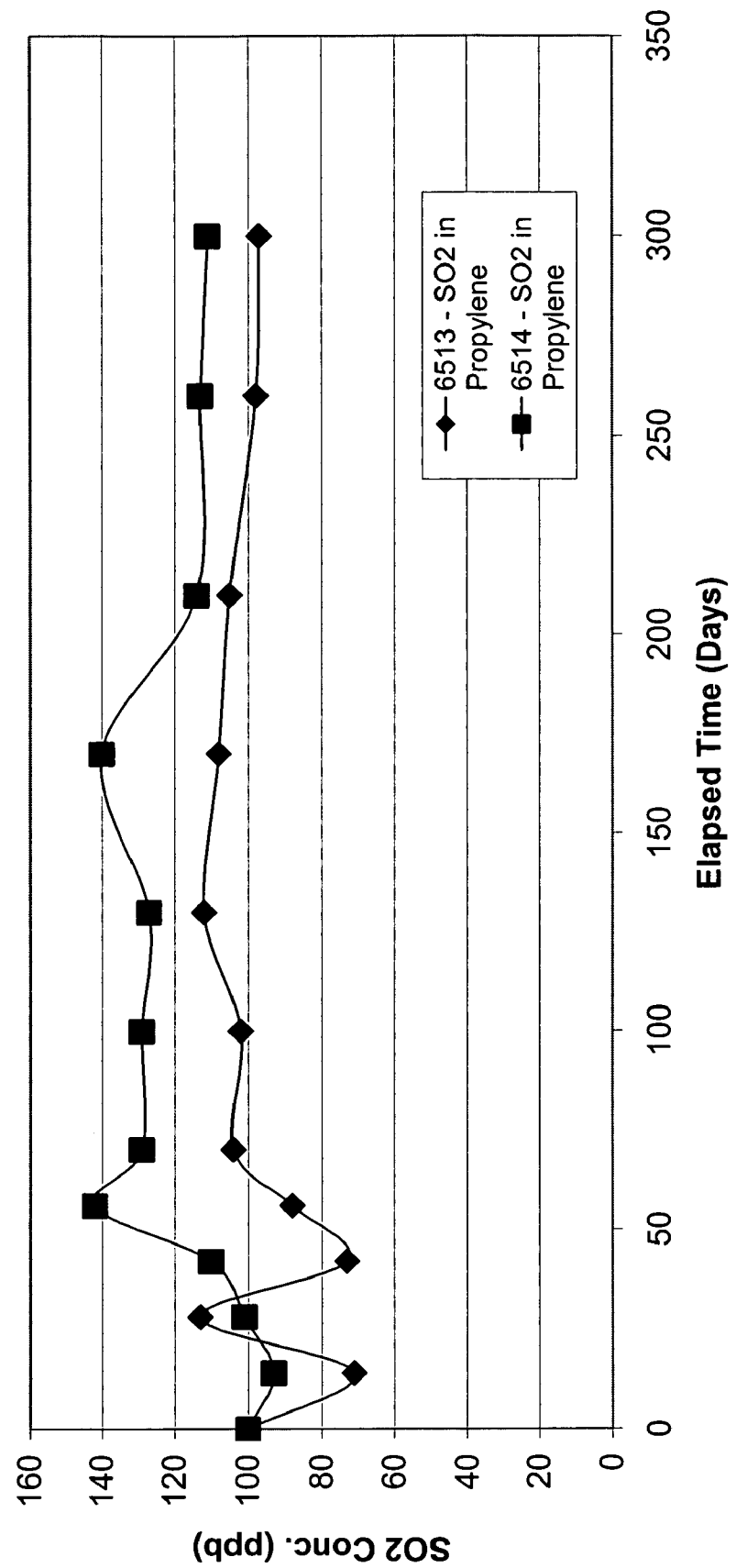
FIG. 6 shows the stability of $H_2S$ and COS concentrations in low-level $H_2S$ and COS standards over time.

As best shown in FIG. 6, Example 12-13 exhibited excellent stability.

Examples 14-17 and Comparative Example 8

Examples 14-17 and Comparative Example 8 were prepared as follows:

Step 1 (Vacuum Brake): Cylinders go through a vacuum/fill bake cycle.

Step 2 (Silane Passivation): Cylinders attached to manifold and vacuumed. Cylinders filled with 1% Silane in N$_2$ to 100 psig and maintained for the period indicated in Table 9. Manifold vented and vacuumed.

Step 3 (Silane Removal and H$_2$S Passivation): Cylinders attached to manifold and vented. Cylinders go through a vacuum/N$_2$ fill cycle. Vacuumed cylinders filled with 5000 ppm H$_2$S in N$_2$ to 100 psig and maintained for the period indicated in Table 9. Manifold vented through a scrubber and vacuumed.

Step 4 (H$_2$S Removal): Cylinders attached to manifold and vented out through scrubber. Cylinders go through a vacuum/N$_2$ fill cycle.

TABLE 9

Passivation Times for Ex. 14-17 and Comp. Ex. 8

| | Silane Passivation (days) | H$_2$S Passivation (days) | H$_2$S (ppb) |
|---|---|---|---|
| Example 14 | 1 | 1 | 109.3 |
| Example 15 | 1 | 2 | 109.3 |
| Example 16 | 1 | 3 | 110.6 |
| Example 17 | 1 | 4 | 96.9 |
| Comparative Example 8 | 4 | 0 | 110.6 |

TABLE 10

H$_2$S Concentration Over Time for Ex. 14-15 and Comp. Ex. 8

| Comp. Ex. 8 | | Ex. 14 | | Ex. 15 | |
|---|---|---|---|---|---|
| days | H$_2$S (ppb) | days | H$_2$S (ppb) | days | H$_2$S (ppb) |
| 0 | 110.6 | 0 | 109.3 | 0 | 109.3 |
| 1 | 104.3 | 2 | 116.8 | 1 | 117.5 |
| 2 | 89.2 | 10 | 106.8 | 2 | 118.6 |
| 10 | 65 | 23 | 97 | 10 | 102.7 |
| 23 | 46.1 | 29 | 100.8 | 23 | 93.3 |
| 29 | 42.2 | 36 | 111.6 | 29 | 91.1 |
| 36 | 45.3 | 42 | 97.6 | 36 | 104 |
| 42 | 30.9 | 57 | 101.9 | 42 | 85.8 |
| | | 65 | 88.5 | 57 | 84.2 |
| | | 79 | 71.6 | 65 | 74.7 |
| | | 205 | 38.9 | 79 | 58.1 |
| | | | | 115 | 38.5 |

TABLE 11

H$_2$S Concentration Over Time for Ex. 16-17

| Ex. 16 | | Ex. 17 | |
|---|---|---|---|
| days | H$_2$S (ppb) | days | H$_2$S (ppb) |
| 0 | 110.6 | 0 | 96.9 |
| 1 | 113.7 | 1 | 99 |
| 2 | 119.2 | 20 | 90.7 |
| 10 | 110.7 | 78 | 101.6 |
| 23 | 108.1 | 132 | 100.5 |
| 29 | 113.2 | 201 | 97.3 |

TABLE 11-continued

H₂S Concentration Over Time for Ex. 16-17

| Ex. 16 | | Ex. 17 | |
|---|---|---|---|
| days | H₂S (ppb) | days | H₂S (ppb) |
| 36 | 123.6 | 230 | 102.2 |
| 42 | 114 | 277 | 103.6 |
| 57 | 124.3 | 329 | 92.5 |
| 65 | 116.1 | | |
| 79 | 88.9 | | |
| 115 | 92.7 | | |
| 269 | 80.9 | | |
| 414 | 61.2 | | |

Figure 7:
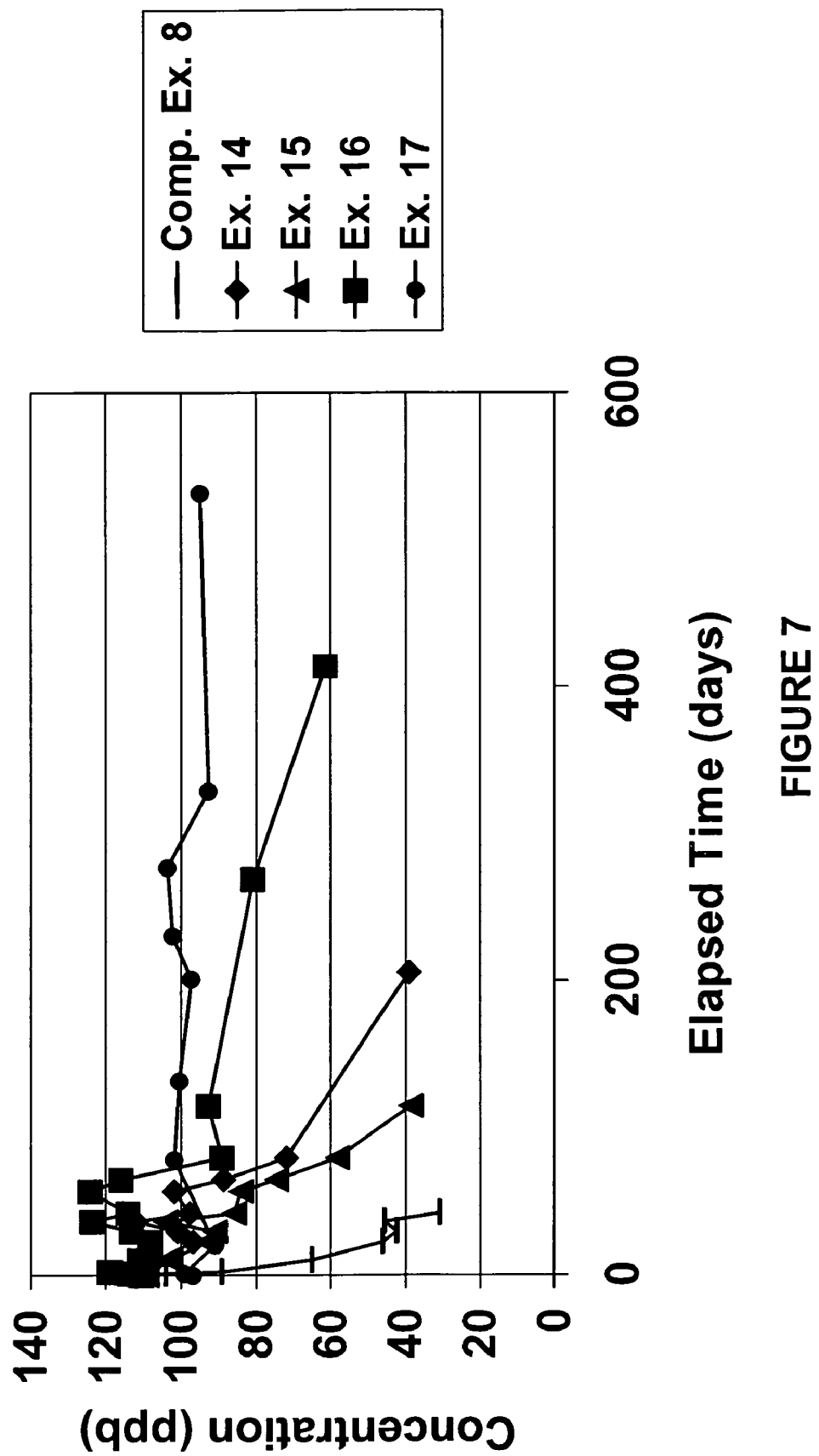
FIG. 7 shows the stability of $H_2S$ concentration in low-level $H_2S$ standards over time.

As best shown in FIG. 7, increasing the H₂S passivation time improved stability.

Although the description herein is intended to be representative of the invention, it is not intended to limit the scope of the appended claims.

What is claimed is:

1. An article of manufacture comprising:
   a) a container having an internal space having a passivated internal metal surface, said passivated internal metal surface selected from the group consisting of aluminum and aluminum alloys; and
   b) a composition to be stored in the container, said composition comprising an acid gas and a balance gas contained within the internal space and in contact with the passivated internal metal surface; wherein
      i) the acid gas has an intended concentration in the balance gas of less than 500 ppb;
      ii) the acid gas is selected from the group consisting of carbon disulfide, carbonylsulfide, and compounds within the formula

Y—S—X wherein S is sulfur, X and Y are the same or different and are independently selected from the group consisting of hydrogen, alkyl, aryl, oxygen, hydoxyl, amine, aminosilane, and alcohol; and
      iii) the passivated internal metal surface comprises A) a coating that is the reaction product of a silicon-containing material and an oxygen-containing material, and B) a coating that is an amount of the concentrated acid gas adsorbed on or in the passivated internal metal surface which is effective to enhance the stability of the intended concentration over time, the concentration of the concentrated acid gas being at least 50,000 times greater than the concentration of the acid gas of the composition that is to be stored in the container.

2. The article of manufacture of claim 1, wherein the acid gas is selected from the group consisting of hydrogen sulfide, carbonyl sulfide, sulfur dioxide, methylthiol, ethylthiol, n-propylthiol, i-propylthiol, and benzylthiol.

3. The article of manufacture of claim 1, wherein the acid gas is selected from the group consisting of hydrogen sulfide, carbonyl sulfide, and sulfur dioxide.

4. The article of manufacture of claim 1, wherein the silicon-containing material is selected from the group consisting of compounds within the general formula (II):

$$SiR^1R^2R^3R^4 \qquad (II)$$

wherein R1, R2, R3, and R4 are the same or different and are independently selected from the group consisting of hydrogen, halogen, amine, alkyl, aryl, halogenated alkyl, and halogenated aryl.

5. The article of manufacture of claim 1, wherein the oxygen-containing compound is selected from the group consisting of moisture, molecular oxygen, metal oxides, and mixtures thereof.

6. The article of manufacture of claim 1, wherein the silicon-containing compound is silane.

7. The article of manufacture of claim 1, wherein the silicon-containing compound is a methyl-containing silane selected from the group consisting of methylsilane, dimethylsilane, trimethylsilane and tetramethylsilane.

8. The article of manufacture of claim 1, wherein the acid gas contained within the internal space has a concentration of about 50-100 ppb.

9. The article of manufacture of claim 8, wherein the acid gas is hydrogen sulfide.

10. The article of manufacture of claim 8, wherein the acid gas is carbonyl sulfide.

11. The article of manufacture of claim 8, wherein the acid gas is sulfur dioxide.

12. The article of manufacture of claim 1, wherein the balance gas is selected from the group consisting of noble gases, nitrogen, ethylene, propylene, and mixtures thereof.

13. The article of manufacture of claim 1, wherein the article is selected from a piping system, a tubing system, a manifold, a gas cylinder having a cylinder valve, and a ton unit.

14. The article of manufacture of claim 13, wherein the internal metal surface to be treated is aluminum.

15. The article of manufacture of claim 1, wherein the internal metal surface to be treated is aluminum.

* * * * *